Nov. 21, 1967

W. L. DALTON 3,353,655

PROTECTIVE PACKAGE

Filed June 23, 1966

INVENTOR.
WILLIAM L. DALTON
BY
George C. Sullivan
Agent 3,353,655

PROTECTIVE PACKAGE

William L. Dalton, San Bruno, Calif., assignor to Lockheed Aircraft Corporation, Burbank, Calif.

Filed June 23, 1966, Ser. No. 559,857
3 Claims. (Cl. 206—1)

ABSTRACT OF THE DISCLOSURE

An article package for electronic devices in which the electronic device is supported by an insert which is mounted within a cylindrical sleeve which in turn is telescoped within a pair of caps thus allowing the device to be inspected by X-Ray or other techniques without removing it from the package.

*Field of the invention*

This invention relates to article packaging and more particularly to a packaging technique for electronic devices featuring a package in which the devices may be conveniently tested and inspected while still protected by the package.

*Description of the prior art*

Previous techniques known in the art of electronic device packaging required that, during testing, either the device be removed from the package or that the package be opened so that the device was exposed. Both of these techniques subjected the device to possible contamination. Moreover, when it was desirable to inspect the device by X-ray inspection techniques it was necessary to remove the device from its package. The supporting of the devices during the X-ray inspection also was a difficult problem due to their small size and their configuration. The latter problem was amplified when it was discovered that the technique of X-ray inspecting the device in a static condition would not show up some defects in the device, like loose bits of solder, for example. To solve this problem, the device was rotated during the X-ray inspection. To make this possible, in the prior art it was necessary to remove the device from its protective package, mount it in a special fixture, inspect it, remove it from the fixture, and if possible, return it to the protective package. This physical handling of the electronic device frequently resulted in distortion and/or breaking off of the leads as well as dropping or otherwise causing injury to the electronic device. This damaging, as well as contamination of the device due to this exposure, costs industry and the government great sums of money each year.

*Summary*

The present invention virtually eliminates this contamination and damage since each electronic device remains within its individual protective package during X-ray inspection, handling, shipping and storage. For testing, only the ends of the leads are exposed while the device itself remains protected. The package not only eliminates physical handling of the electronic device but provides an excellent holding and centering mechanism during X-ray inspection.

Accordingly, an object of the present invention is to provide a package for individual electronic devices.

Another object of the present invention is to provide a package wherein components may be inspected while still in the protective package.

It is a further object of the invention to provide a package wherein the contents may be inspected by X-ray techniques, or other techniques without removing them from their protective packages.

A further object of the present invention is to provide a package whereby a device contained therein is supported in the center of the package to allow the device to be examined while in motion.

*Brief description of the drawings*

The specific nature of the invention, as well as other objects, uses, and advantages will be readily appreciated by reference to the following detailed description of the exemplary embodiments of the apparatus and the appended claims. The various features of the exemplary embodiments according to the invention may be best understood with reference to the accompanying drawings, wherein:

*Description of the preferred embodiments*

Figure 2:
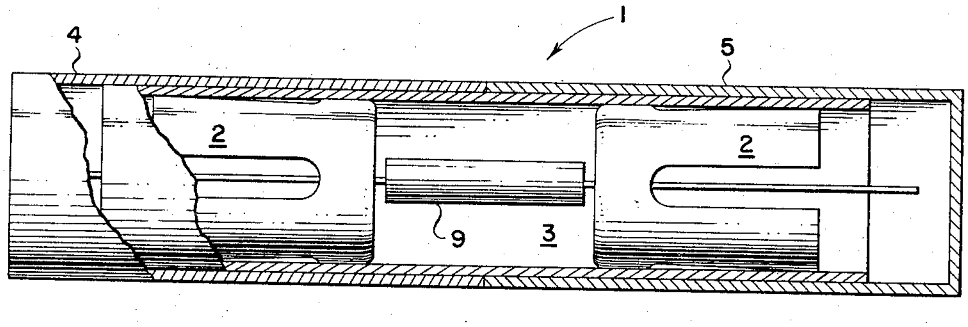
FIGURE 2 is a front elevational view of another package constructed in accordance with the principles of the present invention with a portion broken away to illustrate how an article can be mounted therein.
Figure 1:
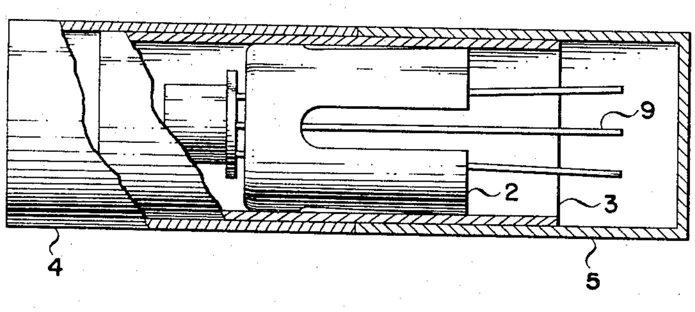
FIGURE 1 is a front elevational view showing a package constructed in accordance with the principles of the present invention with a portion broken away to show the interior.

Referring more particularly to the drawings, the packaging assembly 1 illustrated in FIGURES 1 and 2 comprises insert 2 by which the electrical device 9 is supported in a manner as will be hereinafter explained. The insert 2 is supported by a cylindrical-shaped sleeve 3 which in turn is telescoped within caps 4 and 5.

Figure 3:
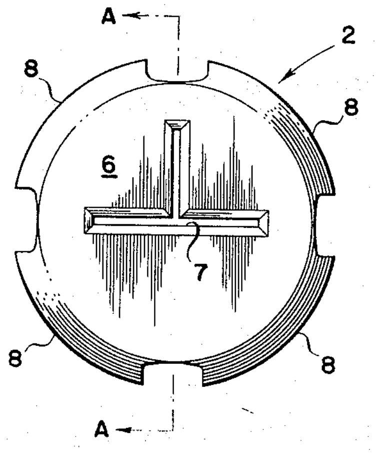
FIGURE 3 is a side elevational view showing the details of an insert.
Figure 4:
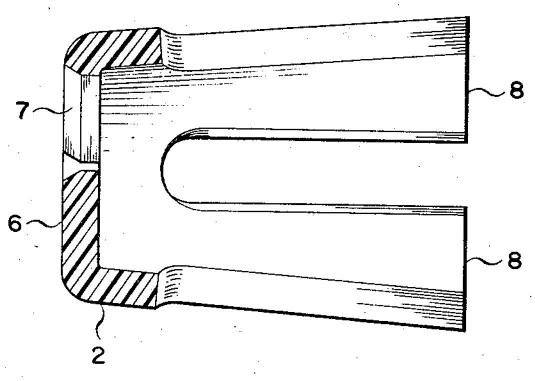
FIGURE 4 is a sectional view of the insert taken along lines A—A in FIGURE 3.

The insert 2, as illustrated in FIGURE 3 and FIGURE 4, consists of a substantially flat portion 6 having a slot, illustrated by the T-shaped slot 7, cut therein. The apex of the slot is centered on the insert for reasons that will be hereinafter explained. Extending downwardly from the flat portion 6 are a plurality of legs 8. Legs 8 are flared outwardly so that they extend beyond the surface of the flat portion. When the insert 2 is mounted inside the sleeve 3, the legs are compressed and press against the inside surface of sleeve 3. This pressure keeps the insert from turning or slipping down the sleeve.

The electronic device is mounted on the insert 2 by inserting the leads through the slot 7. In the case of an axial lead device, the lead is inserted at the apex of the slot. When the device has three leads, each lead is inserted in a leg of the slot so that the device is centered on the insert. It will be understood that the width of the slot is such as to apply sufficient pressure on the leads to keep them from coming out, yet not enough pressure to damage them.

Once the electronic device is inserted in the insert 2, and the insert in turn is mounted within the sleeve 3, it is not necessary to remove the electronic device from this assembly until immediately before final assembly. The device is tested by removing a single cap in the case of a device having all the leads on the same end, as in FIGURE 1 or both caps in the case of an axial-lead device as in FIGURE 2. Thus the device is protected from the damage and contamination caused by handling and exposing of the device.

For dynamic X-ray inspection, the complete package, unopened, is mounted on the fluoroscope so that it can be turned axially. The article remains centered during the slow rotation due to the unique design of the package. Thus, it is possible for the operator to inspect the article as it is slowly rotated without having to continually recenter the article.

Any suitable material may be employed to make the package so long as the characteristics of the material do not interfere with the desired inspection and testing of the encased article. For example, if a non-conductive, transparent, non-shielding material is desired, suitable clear plastic such as polyethylene, polypropylene or similar material can be used. One skilled in the art can easily determine the desired characteristics of the material depending upon the tests and inspections that are to be performed without deviating from the scope of this invention.

It is understood that the package would have application for holding other types of articles besides the electronic device illustrated.

As used herein, it is understood that the phrase "electronic device" includes, but is not limited to, diodes, resistors, capacitors, switches, transistors, as well as integrated circuits, and other electronic component items and devices.

Modifications of this invention not described herein will become apparent to those of ordinary skill in the art. For example, although the illustrated embodiment shows the insert having a T-shaped slot, it is understood that slots having other shapes can be used without deviating from the scope of the invention. Therefore, it is intended that the matter contained in the foregoing description and the accompanying drawings be interpreted as illustrative and not limitative, the scope of the invention being defined in the appended claims.

I claim:

1. A package including a first cap means, a second cap means, a sleeve means having first and second open ends, and at least insert means, said first and second cap means substantially closing the said open ends of said sleeve means and substantially encasing the sleeve means, said insert means being enclosed in said sleeve means, said insert means further defined as having a substantially flat surface with a T-shaped opening therein, and a plurality of protrusions extending downwardly therefrom, the apex of said opening being substantially centered on said insert.

2. A package as in claim 1 wherein the protrusions on said insert are flared outwardly.

3. A package as in claim 2 wherein the protrusions on said insert are slightly deformed by the embracement of said sleeve means.

References Cited

UNITED STATES PATENTS

| | | | |
|---|---|---|---|
| 448,813 | 3/1891 | Bowman | 229—6 |
| 1,265,932 | 5/1918 | Maltby | 229—93 |
| 1,473,635 | 11/1923 | Mann et al. | 229—6 |
| 1,710,543 | 4/1929 | Leo. | |
| 2,453,614 | 11/1948 | Belsinger | 206—65 |
| 3,184,056 | 5/1965 | Kisor | 206—65 |

MARTHA L. RICE, *Primary Examiner*.